United States Patent [19]

Hemingway

[11] Patent Number: 4,853,644

[45] Date of Patent: Aug. 1, 1989

[54] DIFFERENTIAL AMPLIFIER CIRCUIT

[75] Inventor: Thomas K. Hemingway, Hertfordshire, United Kingdom

[73] Assignee: British Aerospace Public Limited Company, London, England

[21] Appl. No.: 159,101

[22] Filed: Feb. 23, 1988

[30] Foreign Application Priority Data

Feb. 23, 1987 [GB] United Kingdom ............... 8704193

[51] Int. Cl.$^4$ ............................................. H03F 3/45
[52] U.S. Cl. ..................................... 330/69; 330/258; 330/261
[58] Field of Search ................. 330/69, 252, 258, 259, 330/260, 261

[56] References Cited

PUBLICATIONS

A. M. Soliman, Novel Phase Compensated 3-Port VCVS Without Matched Operational Amplifiers IEEE, vol. 17, No. 2.

Primary Examiner—Gene Wan
Attorney, Agent, or Firm—Nixon & Vanderhye

[57] ABSTRACT

A high input impedance differential amplification circuit using two operational amplifiers with the input signals coupled to respective ones of the inverting input of one amplifier and the non-inverting input of the other, and with resistance networks of pre-set value relationships coupling the other amplifier inputs and their outputs.

7 Claims, 2 Drawing Sheets

DIFFERENTIAL AMPLIFIER CIRCUIT

BACKGROUND OF THE INVENTION

A previously proposed circuit for the differential amplification of two input signals comprises an operational amplifier with a particular arrangement of feedback and input resistors of which the relative values are such as to achieve a true differential output from the amplifier. In order to achieve a high input impedance for each signal, which is desirable for reasons to be described later herein, the input signals have to be applied to the previously proposed circuit via respective high input impedance unity gain amplifiers. Thus, altogether, three amplifiers are needed which not only incurs a cost penalty but also can limit the obtainable performance.

The 1986 Linear Applications Databook published by National Semiconductor Corporation shows, on page 90, a proposed circuit for a high input impedance instrumentation amplifier using only two operational amplifiers. The input signals are applied to respective ones of the non-inverting inputs of the two amplifiers; the output signal is taken from the output of one of the amplifiers; and first, second, third and fourth resistors are connected respectively between ground and the inverting input of the other amplifier, between the inverting input and the output of this other amplifier, between the output of this other amplifier and the inverting input of the one amplifier and between the inverting input and the output of the one amplifier. The first and fourth resistors are given equal values while the second and third resistors are also made equal to one another and the differential gain of the arrangement is then determined by the ratio of the first and second resistor values.

SUMMARY OF THE INVENTION

The object of this invention is to provide an alternative configuration for a high input impedance differential amplifier, which alternative may be preferred to the above described prior art proposal, for example to more easily permit the adoption of some particular layout design for an overall integrated circuit which incorporates the differential amplifier.

According to one aspect of the invention, there is provided a circit for the differential amplification of a first and a second received signal, the circuit comprising:

first, second, third and fourth electrical conductor portions for receiving said first signal between the first and third portions and said second signal between the second and third portions, the fourth portion being for supplying an output signal of the circuit;

first and second operational amplifiers each having an inverting input, a non-inverting input and an output, the inverting input of the first amplifier being coupled to said first electrical conductor portion, the non-inverting input of the second amplifier being coupled to said second electrical conductor portion, and the output of the first amplifier being coupled to the fourth electrical conductor portion;

first circuit means defining a resistive path having a first resistance value between the non-inverting input of the first amplifier and the output of the second amplifier;

second circuit means defining a resistive path having a second resistance value between the non-inverting input of the first amplifier and said third electrical conductor portion;

a third circuit means defining a resistive path having a third resistance value between the inverting input and output of the second amplifier; and fourth circuit means defining a resistive path having a fourth resistance value between the output of the first amplifier and the inverting input of the second amplifier;

the ratio of the second to the first resistance value being substantially equal to the ratio of the fourth to the third resistance value.

According to a second aspect of the invention, there is provided differential amplification circuit comprising an amplifier with inverting and non-inverting inputs and an output for supplying the amplified difference between two input signals to the circuit, amplification means for ensuring the presentation of a high input impedance to each of the two input signals, and a plurality of resistors connected to the amplifier and amplification means for ensuring true differential amplification of the two input signals and for defining the gain of the circuit, characterised in that the amplification means comprises a single second amplifier (26) with inverting and non-inverting inputs, said input signals are applied to respective ones of the inverting input of the first mentioned amplifier (25) and the non-inverting input of the second amplifier (26), and said plurality of resistors comprise a first resistor (22) connected between a common ground potential point and the non-inverting input of the first mentioned amplifier, a second resistor (21) between the non-inverting input of the first mentioned amplifier (25) and the output of the second amplifier, a third resistor (24) between the output of the first amplifier (25) and the inverting input of the second amplifier (26), and a fourth resistor (23) between the inverting input and the output of the second amplifier, the ratio (R22/R21) of said second to said first resistor being at least substantially equal to the ratio (R24/R23) of the third to the fourth resistor.

BRIEF DESCRIPTION OF THE DRAWINGS

For a better understanding of the invention, reference will be made, by way of example, to the accompanying drawings, in which.

DETAILED DESCRIPTION OF PREFERRED EMBODIMENTS

Figure 1:
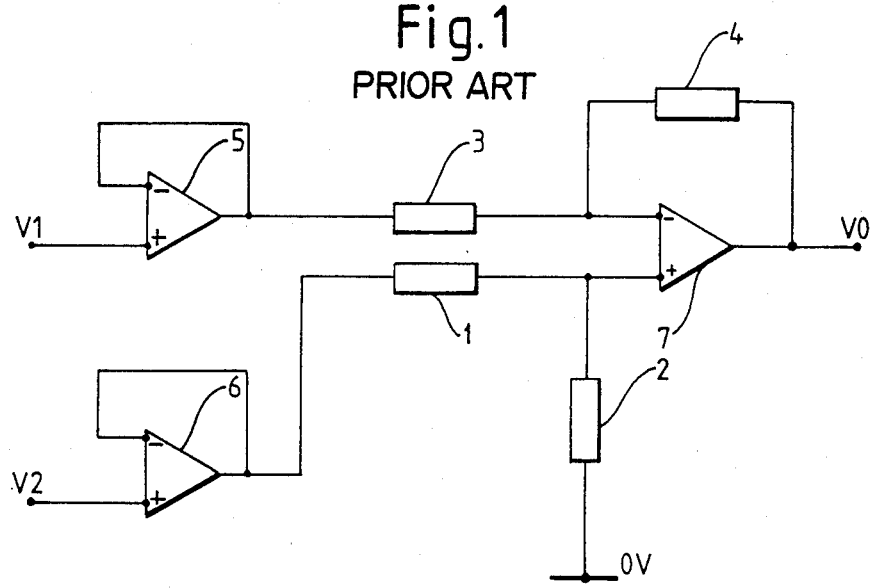
FIG. 1 is a simplified diagram of a previously proposed differential amplifier circuit.

In the previously proposed differential amplifier circuit of FIG. 1, the two input signals VI and V2 are applied via respective unity gain amplifiers 5 and 6 and respective input resistors 3 and 1 to respective ones of the inverting and non-inverting inputs of an operational amplifier 7. A feedback resistor 4 is connected between the output and inverting input of amplifier 7 and a further resistor 2 is connected between its non-inverting input and a common zero-volt reference line for the signals V1 and V2. With R1, R2, R3 and R4 being the resistance values of the resistors 1, 2, 3 and 4 respectively, the output signal V0 from amplifier 7 equals (V2−V2)R4/R3, ie a true differential output is obtained, provided that R4/R3 equals R2/R1 and the open loop differential mode gain of amplifier 7 is very high. Each of the unity gain amplifiers 5 and 6 also comprise a high open-loop gain operational amplifier but with a direct feedback connection between its output and inverting input, the signal V1 or V2 as appropriate being applied to the non-inverting input of the amplifier. The function of the amplifiers 5 and 6 is to provide a high input impedance to the signals V1 and V2. If the amplifiers 5 and 6 were not present, ie if the signals V1 and V2 were to be applied direct to the input resistors 3 and 1, there would still be obtained an output V0=(V2−V1)R4/R3 but the input impedances seen by the signals V1 and V2 are now relatively low and also unequal, that for V1 being approximately equal to R3 and that for V2 being around (R1+R2). Thus, if V1 and V2 were derived from sources generating equal emfs and having finite source impedances, the V1 and V2 would become different even if those source impedances were equal, which may well not be the case. The result, of course, is that for the two sources producing equal emfs, an output signal is produced by amplifier 7 and this is normally undesirable. The presence of the unity gain amplifiers 5 and 6 avoids the above problems but, of course, the circuit then comprises three operational amplifiers.

Figure 2:
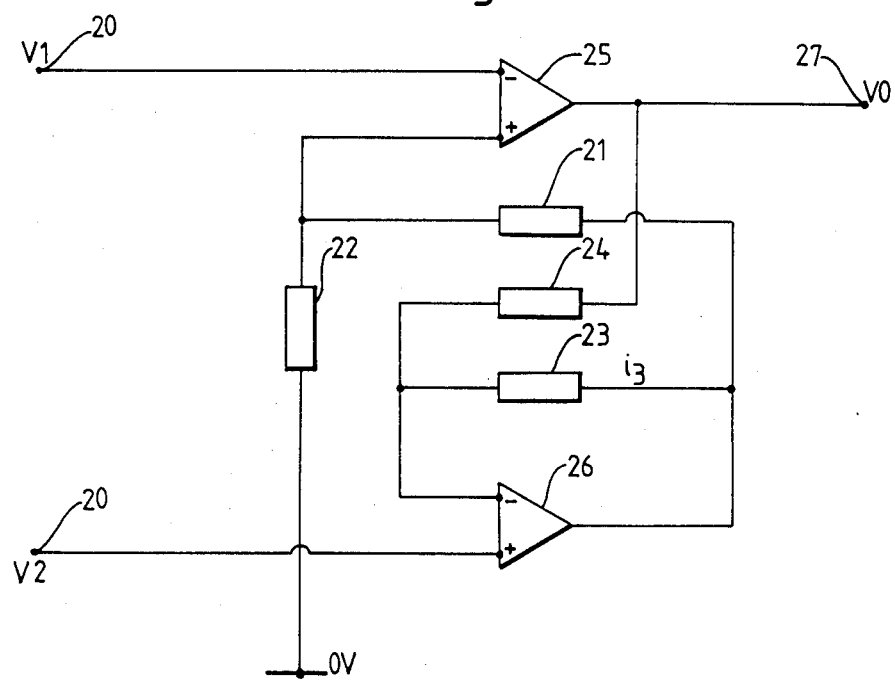
FIG. 2 is a simplified diagram of a differential amplifier circuit in accordance with the present invention.

In the example, shown in FIG. 2, of a differential amplifier circuit according to the invention, the input signals V1 and V2 are applied via input terminals 20 direct to the inverting input of an amplifier 25 and the non-inverting input of an amplifier 26 respectively. The non-inverting input of amplifier 25 is connected via resistor 22 to a common reference line for signals V1 and V2, again a zero-volt reference in this example, and via a resistor 21 to the output of amplifier 26. The inverting input of amplifier 26 is connected via resistor 23 to the output of the same amplifier 26 and via resistor 24 to the output of the amplifier 25. The circuit output terminal 27 is also connected to the output of the amplifier 25. It can be shown by analysis and verified by inspection of the circuit diagram, that the signal V0 at the output of the amplifier 25 equals (V2−V1)(R21+R22)/R21, ie a true differential output is again obtained, provided that R24/R23 equals R22/R21, where R21, R22, R23 and R24 are the resistance values of resistors 21, 22, 23 and 24 respectively. The full analysis will be clear to those skilled in the art. However, very briefly assuming that the open-loop gains of amplifiers 25 and 26 are very high, then for steady state conditions, the potential at the non-inverting input of amplifier 25 must equal the potential V1, at its inverting input while the potential at the inverting input of amplifier 26 must equal the potential V2 at the non-inverting input of the amplifier 26. If the potential at the non-inverting input of the amplifier 25 is V1, then the potential at the output of amplifier 26 must be V1(R21+R22)/R22. Thus, the potential dropped across resistor 23 is defined and hence also the current $i_3$ flowing through it. This current also flows through resistor 24 and hence the voltage drop across it can be calculated and thence also the output voltage V0.

As with the FIG. 1 circuit, the signals V1 and V2 each see a high input impedance. Meanwhile, however, FIG. 2 has only two amplifiers instead of three. This not only reduces cost but, in addition, assuming the detailed design is properly done, the circuit of FIG. 1 can have somewhat superior frequency and offset performance. This is so simply because both these parameters tend to be degraded by the amplifiers of which FIG. 2 has only two instead of three.

Just as with the amplifiers of FIG. 1, it is assumed that the amplifiers 25 and 26 in FIG. 2 each have a high open-loop gain. The term 'high' here means at least several times greater than the designed differential mode gain of the circuit, preferably several orders of magnitude greater. The relationship between the amplifier open-loop gain and the design differential mode gain determines the accurcy of the circuit, for example if the open-loop gain is one hundred times the differential mode gain of the circuit, then the circuit will have an inherent inaccuracy of around one percent. All this applies equally well to the FIG. 1 circuit of course and those skilled in the art will be well able to choose appropriate amplifiers. Although it is not essential, the amplifiers 25 and 26 may well be chosen from the range of integrated circuit operational amplifiers, presently commercially available, which have such high open-loop gains that the point becomes somewhat irrelevant.

Figure 3:
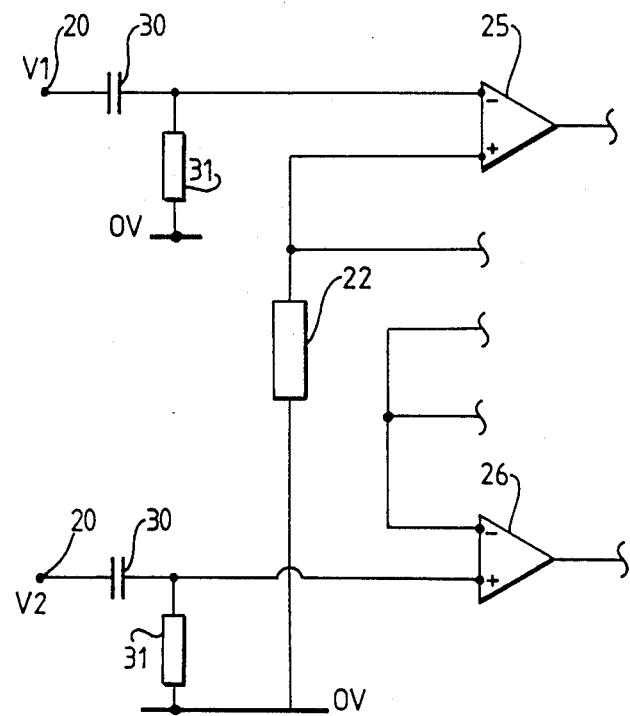
FIG. 3 is a part of a simplified diagram of a modification of the FIG. 2 circuit, the modification also being in accordance with the present invention.

The circuit shown in FIG. 2 is especially suitable where the signals V1 and V2 are direct current (d.c.) to low frequency alternating signals. If the circuit is to handle only alternating signals these can be a.c. coupled into the amplifiers 25 and 26 as shown in FIG. 3. The FIG. 3 circuit is only partly shown but is identical to that of FIG. 2 except that each terminal 20 is connected to its associated amplifier via a capacitor 30 while in each case a resistor 31 is connected between the zero-volt reference line and the point of interconnection between the capacitor and amplifier. The relative values of the capacitors 30 and resistors 31 are chosen in dependence upon the input signal frequency range to be handled-the resistors 31, would normally best have quite high values, perhaps one megohm or more.

Although not always essential, it may be desirable in the case of FIG. 3 to also provide a.c. coupling at the output side of the circuit, ie by interposing a series capacitor (not shown) between the amplifier 25 and output terminal 27. The capacitor should be downstream of the connection to resistor 24 to avoid upsetting the d.c. state of the circuit. Similarly, provided the d.c. state setting paths between the amplifiers are maintained, one or more of the resistors 21 to 24 could be replaced, by an appropriate impedance network intended for example, to achieve some special frequency characteristic. For example, a resistor could be replaced by a resistor and inductor in series, a resistor and a capacitor in parallel, or a combination of these. In this, care has to be taken of course not the render the circuit unstable, ie to turn it into an oscillator circuit.

I claim:

1. A circuit for the differential amplification of a first and a second received signal, the circuit comprising:
 first, second, third and fourth electrical conductor portions for receiving said first signal between the first and third portions and said second signal between the second and third portions, the fourth portion being for supplying an output signal of the circuit;
 first and second operational amplifiers each having an inverting input, a non-inverting input and an output, the inverting input of the first amplifier being coupled to said first electrical conductor portion, the non-inverting input of the second amplifier being coupled to said second electrical conductor portion, and the output of the first amplifier being coupled to the fourth electrical conductor portion;

first circuit means defining a resistive path having a first resistance value between the non-inverting input of the first amplifier and the output of the second amplifier;

second circuit means defining a resistive path having a second resistance value between the non-inverting input of the first amplifier and said third electrical conductor portion;

third circuit means defining a resistive path having a third resistance value between the inverting input and output of the second amplifier; and fourth circuit means defining a resistive path having a fourth resistance value between the output of the first amplifier and the inverting input of the second amplifier;

the ratio of the second to the first resistance value being substantially equal to the ratio of the fourth to the third resistance value.

2. A circuit according to claim 1, wherein each circuit means comprises only one or more resistor components.

3. A circuit according to claim 1, wherein one or each of more than one of said circuit means comprises a combination of components including at least one of a capacitor and an inductor.

4. A circuit according to claim 1, wherein said first and second electrical conductor portions are a.c. coupled to the respective amplifiers.

5. A circuit according to claim 4, wherein each of said first and second electrical conductor portions is connected to the respective amplifier by way of a series capacitor and a resistor is connected between the amplifier side of this series capacitor and said third electrical conductor portion.

6. A circuit according to claim 4, wherein said fourth electrical conductor portion is connected to the output of the first amplifier by way of a series capacitor.

7. Differential amplification circuit comprising an amplifier with inverting and non-inverting inputs and an output for supplying the amplified difference between two input signals to the circuit, amplification means for ensuring the presentation of a high input impedance to each of the two input signals, and a plurality of resistors connected to the amplifier and amplification means for ensuring true differential amplification of the two input signals and for defining the gain of the circuit, characterised in that the amplification means comprises a single second amplifier (26) with inverting and non-inverting inputs, said input signals are applied to respective ones of the inverting input of the first mentioned amplifier (25) and the non-inverting input of the second amplifier (26), and said plurality of resistors comprise a first resistor (22) connected between a common ground potential point and the non-inverting input of the first mentioned amplifier, a second resistor (21) between the non-inverting input of the first mentioned amplifier (25) and the output of the second amplifier, a third resistor (24) between the output of the first amplifier (25) and the inverting input of the second amplifier (26), and a fourth resistor (23) between the inverting input and the output of the second amplifier, the ratio (R22/R21) of said second to said first resistor being at least substantially equal to the ratio (R24/R23) of the third to the fourth resistor.

* * * * *